(12) United States Patent
Ahn et al.

(10) Patent No.: US 6,858,865 B2
(45) Date of Patent: Feb. 22, 2005

(54) DOPED ALUMINUM OXIDE DIELECTRICS

(75) Inventors: Kie Ahn, Chappaqua, NY (US); Leonard Forbes, Corvallis, OR (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/792,777

(22) Filed: Feb. 23, 2001

(65) Prior Publication Data

US 2002/0135048 A1 Sep. 26, 2002

(51) Int. Cl.⁷ .................. H01L 29/12; H01L 29/76
(52) U.S. Cl. ........................... 257/43; 257/410
(58) Field of Search .................. 257/43, 410, 192

(56) References Cited

U.S. PATENT DOCUMENTS

| | | |
|---|---|---|
| 3,583,361 A | 6/1971 | Laudel, Jr. et al. |
| 4,236,994 A | 12/1980 | Dugdale |
| 4,566,173 A | 1/1986 | Gossler et al. |
| 4,814,289 A | 3/1989 | Baeuerle |
| 5,316,982 A | 5/1994 | Taniguchi |
| 5,594,682 A * | 1/1997 | Lu et al. ............... 365/149 |
| 5,633,194 A | 5/1997 | Selvakumar et al. |
| 5,686,328 A | 11/1997 | Zhang et al. |
| 5,807,613 A | 9/1998 | Aguero et al. |
| 5,923,056 A * | 7/1999 | Lee et al. ............... 257/192 |
| 6,240,040 B1 * | 5/2001 | Akaogi et al. ......... 365/230.06 |
| 2002/0017641 A1 | 2/2002 | Lu et al. |

* cited by examiner

Primary Examiner—Amir Zarabian
Assistant Examiner—Kiesha Rose
(74) Attorney, Agent, or Firm—Leffert Jay & Polglaze, P.A.

(57) ABSTRACT

Doped aluminum oxide layers having a porous aluminum oxide layer and methods of their fabrication. The porous aluminum oxide layer may be formed by evaporation physical vapor deposition techniques to facilitate formation of a high-purity aluminum oxide layer. A dopant material is embedded in the pores of the porous aluminum oxide layer and subsequently converted to a dielectric form. The degree of porosity of the porous aluminum oxide layer may be controlled during formation to facilitate control of the level of doping of the doped aluminum oxide layer. Such doped aluminum oxide layers are useful as gate dielectric layers, intergate dielectric layer and capacitor dielectric layers in various integrated circuit devices.

51 Claims, 5 Drawing Sheets

DOPED ALUMINUM OXIDE DIELECTRICS

TECHNICAL FIELD OF THE INVENTION

The present invention relates generally to dielectrics for integrated circuit devices, and in particular to the development of doped aluminum oxide dielectrics and devices containing such dielectrics.

BACKGROUND OF THE INVENTION

To meet demands for faster processors and higher capacity memories, integrated circuit (IC) designers are focusing on decreasing the minimum feature size within integrated circuits. By minimizing the feature size within an integrated circuit, device density on an individual chip increases exponentially, as desired, enabling designers to meet the demands imposed on them. As modern silicon devices become smaller and the minimum feature size of CMOS (complementary metal oxide semiconductor) devices approaches and goes below the 0.1 $\mu$m regime, very thin gate insulators of thickness less than 2 nm (20 Å) will be required to keep the capacitance of the DRAM (dynamic random access memory) capacitor cell in the range of 30 fF. This capacitance value is generally required to provide immunity to radiation, soft errors and a nominal signal-to-noise ratio.

Silicon dioxide ($SiO_2$), the most commonly used insulator, shows high leakage current density at thicknesses in the range of 20 nm due to band-to-band tunneling current or Fowler-Nordheim tunneling current. As a result, high-k dielectric films such as aluminum oxide ($Al_2O_3$), tantalum pentoxide ($Ta_2O_5$) and titanium dioxide ($TiO_2$) have received considerable interest as gate insulators to replace silicon dioxide.

While aluminum oxide has shown considerable promise, its porous nature leads to drawbacks. It has been noted that aluminum oxide porosity is generally the result of an acicular crystalline structure and that some pores may extend through the entire thickness of an aluminum oxide layer having a thickness on the order of 100 nm. Studies have also shown that exposure to humid atmospheres and even normal atmospheric conditions leads to a build-up of water in the pores of aluminum oxide films. This water build-up results in a loss of dielectric properties. In particular, water build-up can lead to a decrease in breakdown voltage of several orders of magnitude.

For the reasons stated above, and for other reasons stated below that will become apparent to those skilled in the art upon reading and understanding the present specification, there is a need in the art for alternative aluminum oxide structures and methods of their production.

SUMMARY

Aluminum oxide has shown considerable promise as a dielectric material for integrated circuit devices. However, its porous nature leads to drawbacks, in that the pores can adsorb water, thus resulting in a detrimental impact on the dielectric properties of the aluminum oxide material. The various embodiments of the invention involve a porous aluminum oxide layer having dopant material embedded in its pores and subsequently converted to a dielectric form. The doped aluminum oxide layer is formed sequentially to facilitate formation of a high-purity aluminum oxide layer and subsequently sealing its pores to impede water adsorption. Doped aluminum oxide layers of various embodiments are especially suited for use as gate dielectric layers, interlayer dielectric layers and capacitor dielectric layers in various integrated circuit devices.

For one embodiment, the invention provides a doped aluminum oxide layer. The doped aluminum oxide layer includes an aluminum oxide layer having pores on a surface and a dopant material filling the pores. The dopant material is silicon, zirconium, hafnium or titanium and is applied to the aluminum oxide layer subsequent to a formation of the aluminum oxide layer.

For another embodiment, the invention provides a doped aluminum oxide layer. The doped aluminum oxide layer includes an aluminum oxide layer having pores on a surface and voids below the surface. The doped aluminum oxide layer further includes a dopant material of silicon, zirconium, hafnium or titanium. The pores contain at least a portion of the dopant material, and the voids are free of the dopant material.

For yet another embodiment, the invention provides a dielectric layer. The dielectric layer includes an aluminum oxide layer having pores on a surface and a second dielectric material embedded in the pores of the aluminum oxide layer. The second dielectric material is formed of a dopant material of silicon, zirconium, hafnium or titanium. The dopant material is embedded in the pores of the aluminum oxide layer and subsequently converted to its dielectric form.

For still another embodiment, the invention provides a dielectric layer. The dielectric layer includes an aluminum oxide layer having pores on a surface and voids below the surface. The dielectric layer further includes a second dielectric material. The second dielectric material is formed by depositing a dopant material in the pores and treating the dopant material to convert it to its dielectric form. The pores contain at least a portion of the second dielectric material, while the voids are free of the second dielectric material.

For one embodiment, the invention provides a method of forming a dielectric layer. The method includes forming a porous aluminum oxide layer on a substrate and forming a dopant layer on the porous aluminum oxide layer. The dopant layer contains a dopant material of silicon, zirconium, hafnium or titanium. The method further includes converting the dopant material to a dielectric form. For a further embodiment, excess dopant material is removed from the surface of the aluminum oxide layer prior to converting the dopant material to its dielectric form.

Further embodiments of the invention include apparatus and methods of varying scope.

DETAILED DESCRIPTION

In the following detailed description of the present embodiments, reference is made to the accompanying drawings that form a part hereof, and in which is shown by way of illustration specific embodiments in which the invention may be practiced. These embodiments are described in sufficient detail to enable those skilled in the art to practice the invention, and it is to be understood that other embodiments may be utilized and that process, electrical or mechanical changes may be made without departing from the scope of the present invention. The terms wafer or substrate used in the following description include any base semiconductor structure. Examples include silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and the terms wafer and substrate include the underlying layers containing such regions/junctions. The following detailed description is, therefore, not to be taken in a limiting sense, and the scope of the present invention is defined only by the appended claims and equivalents thereof.

Figure 1A:
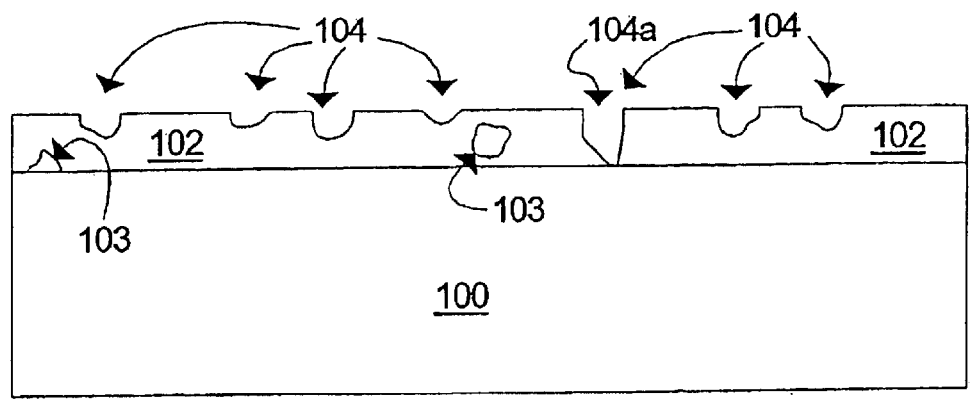
FIGS. 1A–1C are cross-sectional views of a doped aluminum oxide layer taken during various processing stages in accordance with an embodiment of the invention.
Figure 1B:
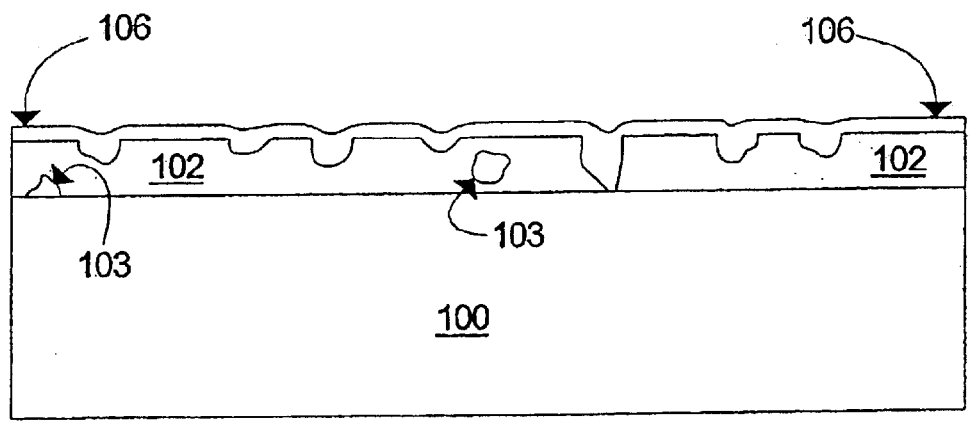
Figure 1C:
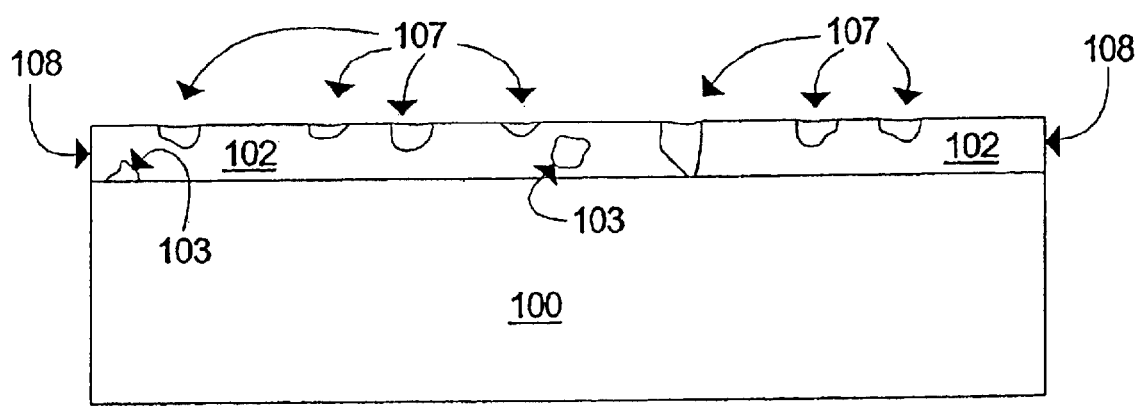

FIGS. 1A–1C depict fabrication of a doped aluminum oxide layer 108 as a portion of an integrated circuit device in accordance with one embodiment of the invention. FIGS. 1A–1C are cross-sectional views taken during various processing stages.

In FIG. 1A an aluminum oxide layer 102 is formed on the substrate 100. The aluminum oxide layer 102 is porous, containing one or more pores 104 on the surface. Note that pores 104 may extend through the aluminum oxide layer 102 to the substrate 100 such as pore 104a. Voids 103 may be contained in the aluminum oxide layer 102. Voids 103 are spaces between grains or crystals of aluminum oxide that do not extend to the surface of the aluminum oxide layer 102.

The substrate 100 may be a monocrystalline silicon material. For example, the substrate 100 may be a wafer of monocrystalline silicon having a [100] orientation. The substrate 100 is generally a semiconductor material doped to a conductivity type, such as a p-type conductivity. As an example, the substrate 100 may be implanted with a p-type dopant, such as boron, followed by an anneal to produce a p-type substrate. As another example, the substrate 100 may have an n-type conductivity, such as a silicon substrate doped using an n-type dopant such as phosphorus or arsenic. Alternatively, the substrate 100 may be some other layer of an integrated circuit device. For example, the substrate 100 may be a floating gate layer of a floating-gate field-effect transistor. The substrate 100 may further include other semiconductor, conductor or insulator layers.

The aluminum oxide layer 102 is formed through physical vapor deposition (PVD) techniques to produce a high-purity film. The PVD techniques preferably are evaporation techniques using a high-purity aluminum or alumina source, such as zone-refined aluminum or sapphire crystals. Such sources are significantly more pure than traditional powder targets commonly used in PVD sputtering techniques. For one embodiment, the aluminum or alumina source has a purity in excess of 99.99%. For a further embodiment, the aluminum or alumina source has a purity of approximately 99.9999%. Evaporation PVD techniques are well understood in the art. Examples include thermal evaporation, electron-beam evaporation and ion-beam-assisted deposition. For aluminum sources, formation of an aluminum oxide layer 102 would require reactive evaporation of the aluminum source in an oxygen-containing atmosphere, a technique well known in the art.

The level of porosity of the aluminum oxide layer 102 may be expressed as packing density. Packing density, p, is a measure of the extent individual grains or crystals of aluminum oxide occupy the gross volume of the aluminum oxide layer 102 relative to voids or pores. Packing density has been defined in literature by the relation:

$$p = \sigma/(\rho_{sc} h)$$

where:

σ is the surface density of the layer;

$\rho_{sc}$ is the volume density of the skeleton of the film; and h is the geometric height of the film As a first approximation, $\rho_{sc}$ can be equated to the density of sapphire, or 3.99 g/cm$^3$.

Wide ranges of packing density are readily producible in aluminum oxide films as has been reported in the literature. See, e.g., Brik, E. B., "Effect of Substrate Temperature on Density of Aluminum Oxide Films," Opt. Mekh. Promst. 57 (1), pp. 50–52 (January 1990) (reporting packing density values ranging from 0.66 to 0.95). Vacuum-deposited aluminum oxide films on cold substrates are generally amorphous while an acicular crystalline structure appears at higher substrate temperatures. Id.

The degree of packing density can be easily controlled through the use of ion bombardment or plasma activation during deposition. As demonstrated in one study, packing density of electron-beam evaporated aluminum oxide films can be controlled through oxygen ion bombardment during deposition. In this study, the index of refraction, and therefore the film density, first rose and then decreased with increasing ion current density for substrate temperatures between 70° C. and 250° C. See, Franzen, W., et al., "Study of Oxygen-Ion-Beam-Assisted Evaporated Aluminum Oxide Films," Mat. Res. Soc. Symp. Proc., Vol. 29, pp. 825–30 (1993). Similarly, the addition of plasma activation during film deposition has been shown to produce a glassy fracture and denser microstructure than film deposition without plasma activation. See, Zywitzki, O., et al., "Effect of Plasma Activation on the Phase Transformations of Aluminum Oxide," Surface and Coatings Tech. 76–77, pp. 745–762 (1995).

The aluminum oxide layer 102 is a porous layer having a packing density of less than 1. For one embodiment, the aluminum oxide layer 102 has a packing density of between approximately 0.65 and 0.999. For a further embodiment, the aluminum oxide layer 102 has a packing density of between approximately 0.85 and 0.999.

The aluminum oxide layer 102 is doped, subsequent to deposition or formation, to improve the dielectric properties of the resultant film. In FIG. 1B, a dopant layer 106 is formed on the aluminum oxide layer 102. The dopant layer 106 contains a dopant material. For one embodiment, the dopant layer 106 contains silicon (Si). For additional embodiments, the dopant layer 106 may contain zirconium (Zr), titanium (Ti) or hafnium (Hf). The dopant layer 106 fills pores 104 of the aluminum oxide layer 102 and covers the surface of the aluminum oxide layer 102.

The dopant layer 106 may be formed by PVD or chemical vapor deposition (CVD) techniques as a blanket deposition. As one example, a silicon-containing dopant layer 106 may be formed by CVD using silane ($SiH_4$) or other suitable silicon precursor. For one embodiment, a dilute silane feed, e.g., 2% silane in nitrogen ($N_2$), is pulsed into a reaction chamber for deposition of the dopant layer 106 on the aluminum oxide layer 102. The dopant layer 106 is deposited to a thickness less than or equal to an average diameter of the pores 104 using a substrate temperature of approximately 300° C. to 350° C. This process is similar to the passivation of a copper substrate by silicide formation as provided in Hymes, S., et al., "Passivation of Copper by Silicide Formation in Dilute Silane," Mat. Res. Soc. Conf. Proc., ULSI-VII, pp. 425–31 (1992). For a further embodiment, the dopant layer 106 is deposited to a thickness of less than approximately 5 nm.

In FIG. 1C, excess dopant material is optionally removed from the surface of the aluminum oxide layer 102. This leaves islands 107 of dopant material, i.e., that material filling the pores 104, embedded in the surface of the aluminum oxide layer 102. For one embodiment, removal of excess dopant involves exposing the surface of the dopant layer 106 to a mild ion beam, such as a beam of argon (Ar) ions. Removal of excess dopant material can eliminate the series capacitance effects of two adjacent dielectric layers.

For one embodiment, the aluminum oxide layer 106 has a packing density such that the dopant material embedded in the surface of the aluminum oxide layer 102, e.g., the islands 107 of dopant material, constitutes approximately 0.1% to 30% by weight of the doped aluminum oxide layer 108. For a further embodiment, the aluminum oxide layer 106 has a packing density such that the dopant material embedded in the surface of the aluminum oxide layer 102 constitutes approximately 0.1% to 10% by weight of the doped aluminum oxide layer 108.

Whether or not the excess dopant material is removed, the dopant material is subsequently treated to homogenize the doped aluminum oxide layer 108. Such treatment of the dopant material can include oxidation or nitridation to convert the dopant material to its oxide or nitride form appropriate to impart dielectric properties to the dopant material.

For one embodiment, the dopant material is oxidized by rapid thermal annealing in an oxidizing atmosphere, such as an oxygen-containing atmosphere. The oxygen-containing atmosphere should preferably contain sufficient oxygen to oxidize all of the dopant material. For example, for a dopant layer 106 containing silicon, the oxygen-containing atmosphere should contain sufficient oxygen to convert all of the silicon, i.e., the dopant layer 106 or the islands 107 of dopant material, to silicon dioxide. For other embodiments, the treated dopant material includes zirconium dioxide ($ZrO_2$), hafnium dioxide ($HfO_2$) or titanium dioxide ($TiO_2$), formed by oxidation of zirconium, hafnium or titanium dopant materials, respectively.

For another embodiment, the dopant material is nitrided by rapid thermal nitridation in a nitrogen-containing atmosphere. The nitrogen-containing atmosphere should preferably contain sufficient nitrogen to nitridate all of the dopant material. For example, for a dopant layer 106 containing silicon, the nitrogen-containing atmosphere should contain sufficient nitrogen to convert all of the silicon, i.e., the dopant layer 106 or the islands 107 of dopant material, to silicon nitride ($Si_3N_4$).

Figure 1D:
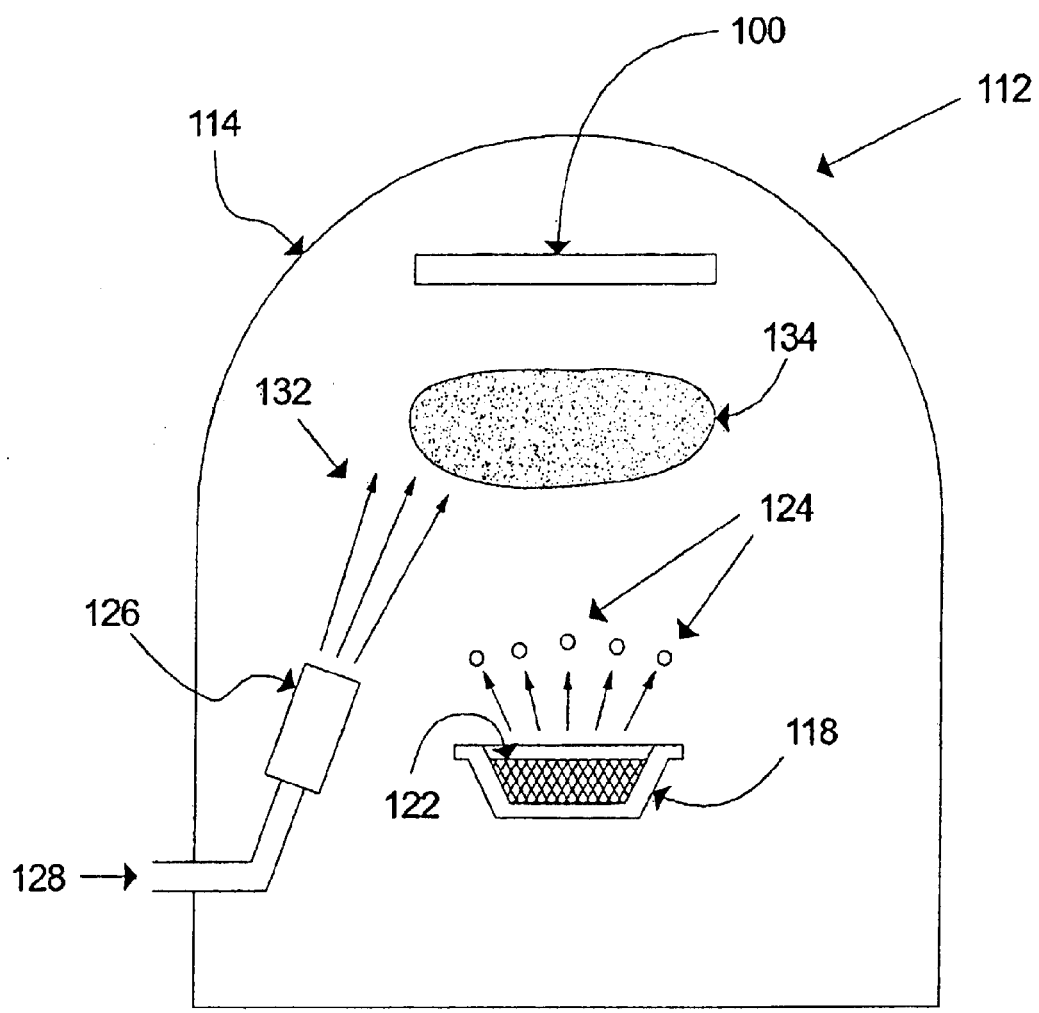
FIG. 1D is a cross-sectional view of one deposition system for use in forming the aluminum oxide layer of FIGS. 1A–1C.

FIG. 1D is a cross-sectional view of one deposition system 112 for use in forming an aluminum oxide layer 102 as described above. The deposition system 112 includes a chamber 114 for containing the substrate 100 under vacuum. A crucible 118 holds an aluminum or alumina source 122.

The source 122 is heated, e.g., by resistive heating or electron-beam bombardment, to produce vaporized species 124 for deposition on a surface of the substrate 100. If the vaporized species 124 are aluminum atoms, they may be reacted with an oxygen-containing atmosphere within the chamber 114 to produce aluminum oxide.

An ion gun 126 may be included in the deposition system 112 to provide ion beams 132 impinging on the surface of the substrate 100. The ion beams 132 generally impinge on the surface of substrate 100 at some angle, e.g., approximately 20°. A gas inlet 128 provides an ion source for the ion gun 126, e.g., oxygen or argon to produce oxygen ions and argon ions, respectively. For plasma activation of the vaporized species 124, a plasma 134 is formed between the crucible 118 and the substrate 100.

The doped aluminum oxide layer 108 may be used as a dielectric layer in a variety of integrated circuit devices subsequent to converting the dopant material to its dielectric form. Example uses include gate dielectric layers for field-effect transistors, intergate dielectric layers for floating-gate transistors and capacitor dielectric layers. The doped aluminum oxide layer 108 differs from layers of aluminum oxide that are doped during deposition in that the dopant material is not dispersed throughout the layer. The evaporation PVD techniques facilitate use of high-purity sources. The evaporation PVD techniques further facilitate control over the degree of porosity, and thus the dopant level, of the resultant layer.

Figure 2:
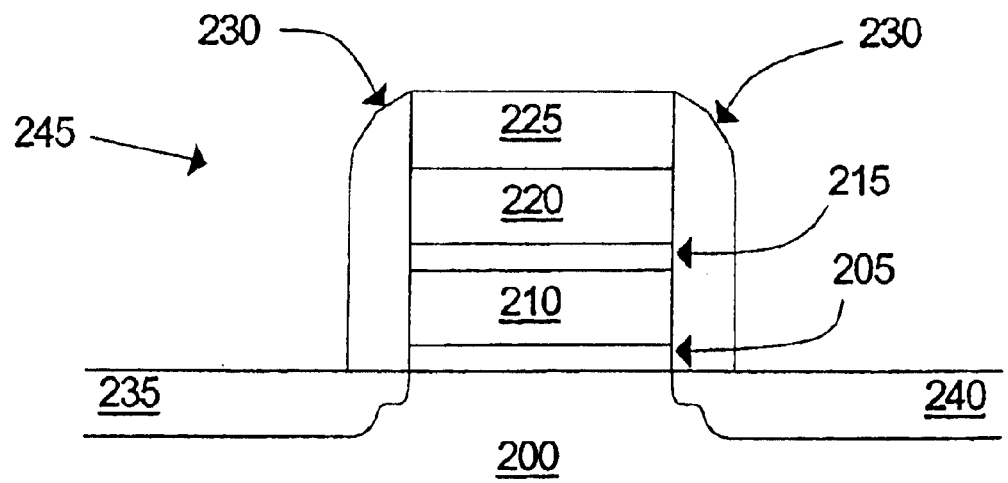
FIG. 2 is a cross-sectional view of a field-effect transistor in accordance with an embodiment of the invention.

FIG. 2 is a cross-sectional view of a field-effect transistor having a gate stack 245 overlying a substrate 200, a first source/drain region 235 in the substrate 200 adjacent a first sidewall of the gate stack 245, and a second source/drain region 240 in the substrate 200 adjacent a second sidewall of the gate stack 245. The gate stack 245 includes a gate dielectric layer 205. The gate dielectric layer 205 contains a doped aluminum oxide layer in accordance with an embodiment of the invention. Gate stack 245 further includes a conductor, often containing a conductively-doped polysilicon layer 210 overlying the gate dielectric layer 205, a metal layer 220, and a conductive barrier layer 215 interposed between the polysilicon layer 210 and the metal layer 220. Insulative cap layer 225 and sidewall spacers 230 insulate and protect the gate stack 245 from other adjacent layers. The field-effect transistor of FIG. 2 may be an access transistor of a DRAM memory cell, having the first source/drain region 235 coupled to a bit line and the second source/drain region 240 coupled to a cell capacitor.

Figure 3:
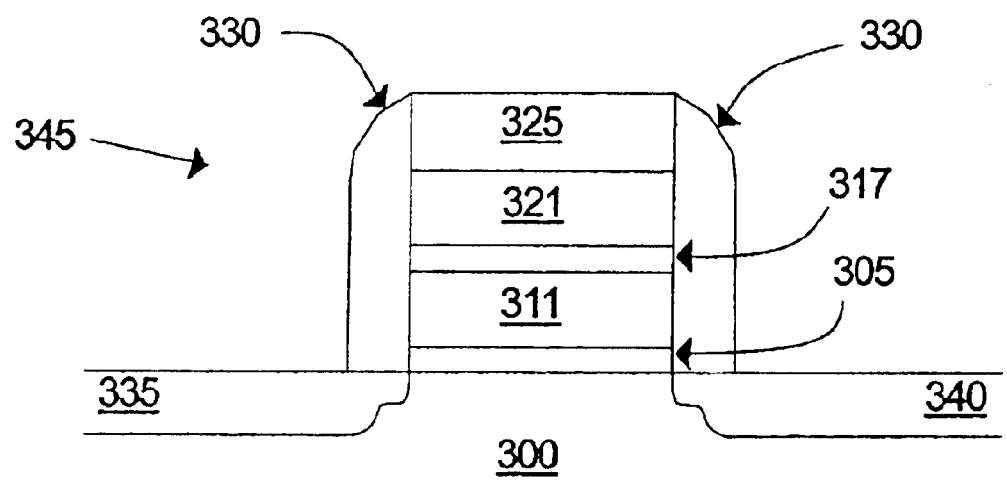
FIG. 3 is a cross-sectional view of a floating-gate field-effect transistor in accordance with an embodiment of the invention.

FIG. 3 is a cross-sectional view of a floating-gate field effect transistor, or simply a floating-gate transistor, having a gate stack 345 overlying a substrate 300, a first source/drain region 335 in the substrate 300 adjacent a first sidewall of the gate stack 345, and a second source/drain region 340 in the substrate 300 adjacent a second sidewall of the gate stack 345. The gate stack 345 includes a gate dielectric layer 305. For one embodiment, the gate dielectric layer 305 contains a doped aluminum oxide layer in accordance with an embodiment of the invention. Gate stack 345 further includes a floating-gate layer 311, a control-gate layer 321 and an intergate dielectric layer 317 interposed between the floating-gate layer 311 and the control-gate layer 321. For one embodiment, the intergate dielectric layer 317 contains a doped aluminum oxide layer in accordance with an embodiment of the invention.

Insulative cap layer 325 and sidewall spacers 330 insulate and protect the gate stack 345 from other adjacent layers. The floating-gate transistor of FIG. 3 may be a flash memory cell, having the first source/drain region 335 coupled to a bit line of a flash memory array and having at least the control-gate layer 321 coupled to a word line of the flash memory array. The second source/drain region 340 is generally commonly coupled among all memory cells of the flash memory array or a portion of the flash memory array.

Figure 4:
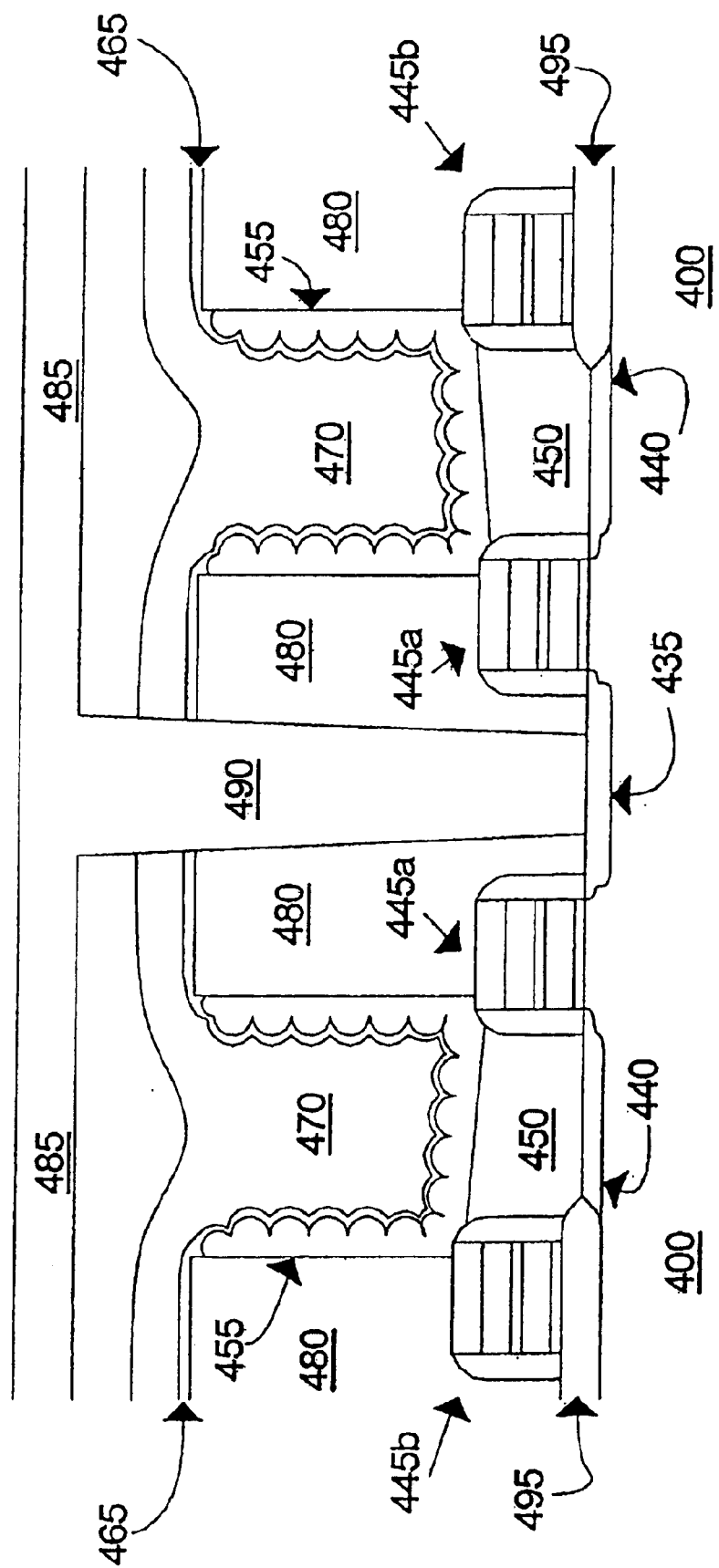
FIG. 4 is a cross-sectional view of a portion of a DRAM memory array in accordance with an embodiment of the invention.

FIG. 4 is a cross-sectional view of a portion of a DRAM memory array. The memory array includes word lines 445a as access transistors overlying the substrate 400. Word lines 445b are formed overlying isolation regions 495 and are coupled to access transistors for memory cells outside the plane of the drawing. Each memory cell of the DRAM memory array includes an access transistor and a cell capacitor.

Each word line 445a has a first source/drain region 435 coupled to a bit line 485 through a bit-line contact 490. Each word line 445a further has a second source/drain region 440 coupled to a first plate 455 of a cell capacitor, such as through a conductive plug 450. The cell capacitor has a second plate 470 and a cell dielectric layer 465 interposed between the first plate 455 and the second plate 470. The second plate 470, or cell plate, is generally shared among all memory cells of the memory array or a portion of the memory array. Insulating layer 480 provides structural support to the cell capacitors as well as electrical isolation of adjacent conductive layers.

For one embodiment, the cell dielectric layer 465 contains a doped aluminum oxide layer in accordance with an embodiment of the invention. For another embodiment, the word lines 445a contain a doped aluminum oxide gate dielectric layer in accordance with an embodiment of the invention.

Figure 5:
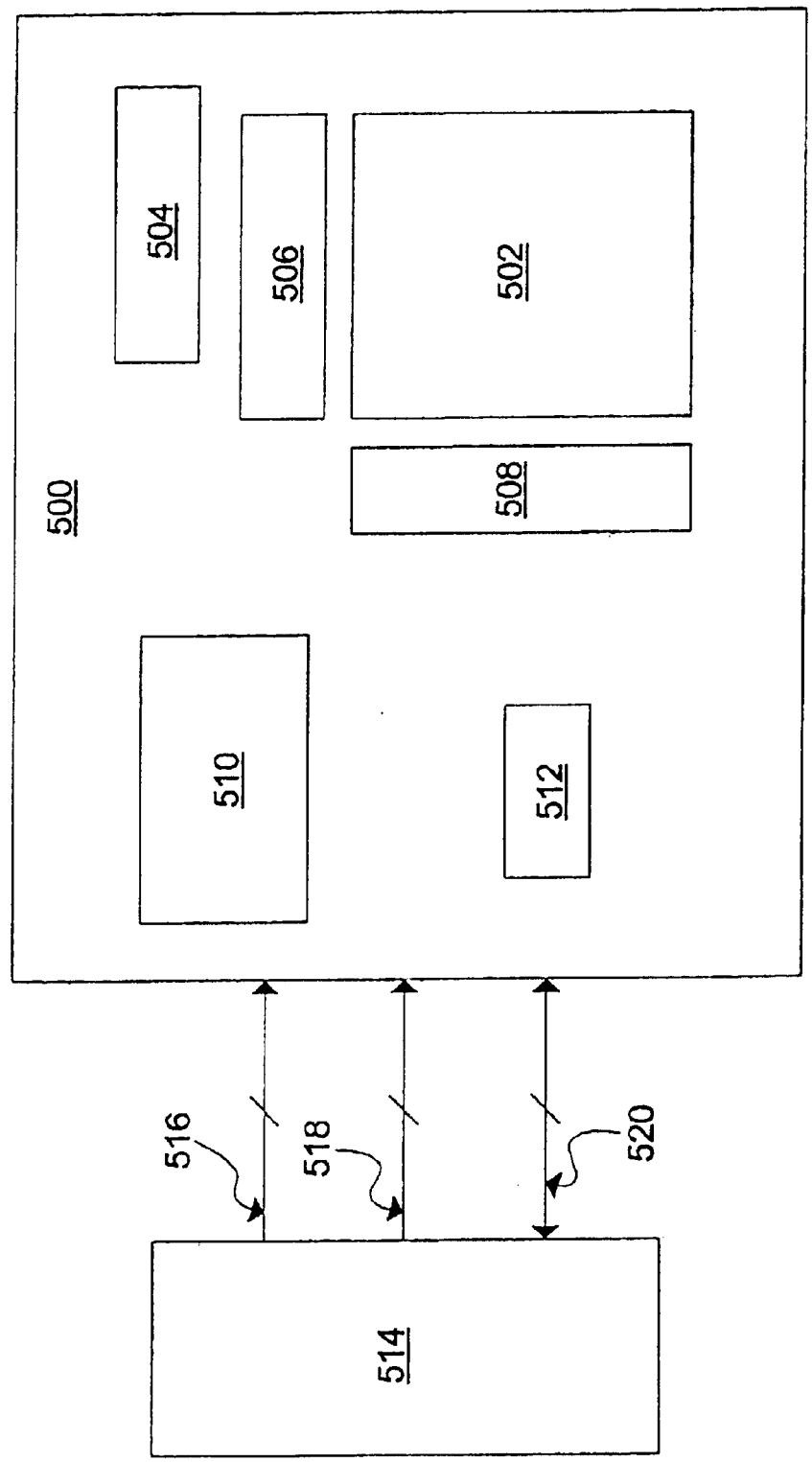
FIG. 5 is a simplified block diagram of an integrated circuit memory device in accordance with an embodiment of the invention.

FIG. 5 is a simplified block diagram of an integrated circuit memory device 500 in accordance with an embodiment of the invention. The memory device 500 may include a DRAM device or a flash memory device. The memory device 500 includes an array of memory cells 502, an address decoder 504, row access circuitry 506, column access circuitry 508, control circuitry 510, and Input/Output (I/O) circuitry 512. For a DRAM memory device, the memory array 502 contains memory cells having an access transistor coupled between a bit line and a capacitor. For a flash memory device, the memory array 502 contains flash memory cells having a floating-gate transistor coupled to a bit line.

The memory device 500 can be coupled to a processor 514 or other memory controller for accessing the memory array 502. The memory device 500 coupled to a processor 514 forms part of an electronic system. Some examples of electronic systems include personal computers, peripheral devices, wireless devices, digital cameras, personal digital assistants (PDAs) and audio recorders.

The memory device 500 receives control signals across control lines 516 from the processor 514 to control access to the memory array 502. Access to the memory array 502 is directed to one or more target memory cells in response to address signals received across address lines 518. Once accessed in response to the control signals and the address signals, data is written to or read from the memory cells across DQ lines 520.

The memory cells of the memory array 502 are generally arranged in rows and columns with a memory cell located at each intersection of a bit line and a word line. Those memory cells coupled to a single word line are generally referred to as a row of memory cells while those memory cells coupled to a single bit line are generally referred to as a column of memory cells. The array of memory cells 502 includes at least one memory cell having a gate dielectric layer, an intergate dielectric layer or a capacitor dielectric layer in accordance with the invention.

It will be appreciated by those skilled in the art that additional circuitry and control signals can be provided, and that the memory device of FIG. 5 has been simplified to help focus on the invention. It will be understood that the above description of a memory device is intended to provide a general understanding of the memory and is not a complete description of all the elements and features of a typical memory device.

As recognized by those skilled in the art, memory devices of the type described herein are generally fabricated as an integrated circuit containing a variety of semiconductor devices. The integrated circuit is supported by a substrate. Integrated circuits are typically repeated multiple times on each substrate. The substrate is further processed to separate the integrated circuits into dies as is well known in the art.

The foregoing figures were used to aid the understanding of the accompanying text. However, the figures are not drawn to scale and relative sizing of individual features and layers are not necessarily indicative of the relative dimensions of such individual features or layers in application. Accordingly, the drawings are not to be used for dimensional characterization.

CONCLUSION

Aluminum oxide has shown considerable promise as a dielectric material for integrated circuit devices. However, its porous nature leads to drawbacks in that the pores can adsorb water, thus resulting in a detrimental impact on the dielectric properties of the aluminum oxide material. The various embodiments of the invention involve a porous aluminum oxide layer having dopant material embedded in its pores and subsequently converted to a dielectric form. The doped aluminum oxide layer is formed sequentially to facilitate formation of a high-purity aluminum oxide layer and subsequently sealing its pores to impede water adsorption. Doped aluminum oxide layers of various embodiments are especially suited for use as gate dielectric layers, intergate dielectric layers and capacitor dielectric layers in various integrated circuit devices.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. For example, other materials, shapes, deposition techniques and removal techniques may be utilized with the invention. Accordingly, this application is intended to cover any adaptations or variations of the invention. It is manifestly intended that this invention be limited only by the following claims and equivalents thereof.

What is claimed is:

1. A doped aluminum oxide layer, comprising:
   an aluminum oxide layer having pores on a surface; and
   a dopant material filling the pores;
   wherein the dopant material is selected from the group consisting of silicon, zirconium, hafnium and titanium;
   wherein the dopant material is applied to the aluminum oxide layer subsequent to a formation of the aluminum oxide layer; and
   wherein the aluminum oxide layer further includes voids below the surface and wherein the voids are free of the dopant material.

2. The doped aluminum oxide layer of claim 1, wherein the aluminum oxide layer is formed by a method selected from the group consisting of thermal evaporation, electron-beam evaporation and ion-beam-assisted deposition.

3. The doped aluminum oxide layer of claim 2, wherein a degree of porosity of the aluminum oxide layer is controlled during formation of the aluminum oxide layer using a method selected from the group consisting of ion bombardment and plasma activation.

4. The doped aluminum oxide layer of claim 2, wherein a degree of porosity of the aluminum oxide layer is controlled by bombarding the surface of the aluminum oxide layer with oxygen ions during formation.

5. The doped aluminum oxide layer of claim 1, wherein the aluminum oxide layer has a packing density between approximately 0.65 and 0.999.

6. The doped aluminum oxide layer of claim 1, wherein the aluminum oxide layer has a packing density between approximately 0.85 and 0.999.

7. The doped aluminum oxide layer of claim 1, wherein the dopant material constitutes approximately 0.1% to 30% by weight of the doped aluminum oxide layer.

8. The doped aluminum oxide layer of claim 1 wherein the dopant material constitutes approximately 0.1% to 10% by weight of the doped aluminum oxide layer.

9. The doped aluminum oxide layer of claim 1, wherein the aluminum oxide layer has a degree of porosity such that the dopant material filling the pores of the aluminum oxide layer constitutes approximately 0.1% to 30% by weight of the doped aluminum oxide layer.

10. The doped aluminum oxide layer of claim 1, wherein the aluminum oxide layer has a degree of porosity such that the dopant material filling the pores of the aluminum oxide layer constitutes approximately 0.1% to 10% by weight of the doped aluminum oxide layer.

11. The doped aluminum oxide layer of claim 1, wherein the dopant material is blanket deposited on the aluminum oxide layer.

12. The doped aluminum oxide layer of claim 11, wherein excess dopant material is removed from the surface of the aluminum oxide layer.

13. The doped aluminum oxide layer of claim 12, wherein removing the excess dopant material comprises exposing the excess dopant material to an ion beam.

14. The doped aluminum oxide layer of claim 13, wherein exposing the excess dopant material to an ion beam further comprises exposing the excess dopant material to a beam of argon ions.

15. The doped aluminum oxide layer of claim 11, wherein the dopant material is silicon formed by a chemical vapor deposition using dilute silane in nitrogen and a substrate temperature of approximately 300° C. to 350° C.

16. The doped aluminum oxide layer of claim 11, wherein the dopant material is deposited to a thickness less than or equal to an average diameter of the pores.

17. A doped aluminum oxide layer, comprising:
an aluminum oxide layer having pores on a surface and voids below the surface; and
a dopant material;
wherein the dopant material is selected from the group consisting of silicon, zirconium, hafnium and titanium;
wherein the pores contain at least a portion of the dopant material; and
wherein the voids are free of the dopant material.

18. A dielectric layer, comprising:
an aluminum oxide layer having pores on a surface; and
a second dielectric material embedded in the pores of the aluminum oxide layer;
wherein the second dielectric material is formed of a dopant material selected from the group consisting silicon, zirconium, hafnium and titanium;
wherein the dopant material is embedded in the pores of the aluminum oxide layer after formation of the aluminum oxide layer and subsequently converted to a dielectric form selected from the group consisting of an oxide form and a nitride form; and
wherein the aluminum oxide layer further contains voids below the surface and wherein the voids are free of the second dielectric material.

19. The dielectric layer of claim 18, wherein the aluminum oxide layer is formed by a method selected from the group consisting of thermal evaporation, electron-beam evaporation and ion-beam-assisted deposition.

20. The dielectric layer of claim 19, wherein a degree of porosity of the aluminum oxide layer is controlled during formation of the aluminum oxide layer using a method selected from the group consisting of ion bombardment and plasma activation.

21. The dielectric layer of claim 19, wherein a degree of porosity of the aluminum oxide layer is controlled by bombarding the surface of the aluminum oxide layer with oxygen ions during formation.

22. The dielectric layer of claim 18, wherein the aluminum oxide layer has a packing density between approximately 0.65 and 0.999.

23. The dielectric layer of claim 18, wherein the aluminum oxide layer has a packing density between approximately 0.85 and 0.999.

24. The dielectric layer of claim 18, wherein the dopant material embedded in the pores constitutes approximately 0.1% to 30% by weight of the dielectric layer.

25. The dielectric layer of claim 18, wherein the dopant material embedded in the pores constitutes approximately 0.1% to 10% by weight of the dielectric layer.

26. The dielectric layer of claim 18, wherein the aluminum oxide layer has a degree of porosity such that the dopant material embedded in the pores constitutes approximately 0.1% to 30% by weight of the dielectric layer.

27. The dielectric layer of claim 18, wherein the aluminum oxide layer has a degree of porosity such that the dopant material embedded in the pores constitutes approximately 0.1% to 10% by weight of the dielectric layer.

28. The dielectric layer of claim 18, wherein the dopant material is blanket deposited on the aluminum oxide layer and subsequently treated to convert the dopant material to its dielectric form.

29. The dielectric layer of claim 28, wherein excess dopant material is removed from the surface of the aluminum oxide layer prior to converting the dopant material to its dielectric form.

30. The dielectric layer of claim 29, wherein removing the excess dopant material comprises exposing the excess dopant material to an ion beam.

31. The dielectric layer of claim 30, wherein exposing the excess dopant material to an ion beam further comprises exposing the excess dopant material to a beam of argon ions.

32. The dielectric layer of claim 28, wherein the dopant material contains silicon formed by a chemical vapor deposition using dilute silane in nitrogen and a substrate temperature of approximately 300° C. to 350° C., and wherein the silicon of the dopant material is converted to silicon dioxide using rapid thermal annealing in an oxygen-containing atmosphere.

33. The dielectric layer of claim 28, wherein the dopant material is deposited to a thickness less than or equal to an average diameter of the pores.

34. The dielectric layer of claim 18, wherein the dielectric layer is a gate dielectric layer of a field-effect transistor.

35. The dielectric layer of claim 18, wherein the dielectric layer is an intergate dielectric layer of a floating-gate field-effect transistor.

36. The dielectric layer of claim 18, wherein the dielectric layer is a capacitor dielectric layer of a capacitor.

37. A dielectric layer, comprising:

an aluminum oxide layer having pores on a surface and voids below the surface; and a second dielectric material;

wherein the second dielectric material is formed by depositing a dopant material in the pores and treating the dopant material to convert it to a dielectric form selected from the group consisting of an oxide and a nitride;

wherein the pores contain at least a portion of the second dielectric material; and wherein the voids are free of the second dielectric material.

38. The dielectric layer of claim 37, wherein the second dielectric material is selected from the group consisting of oxide forms of silicon, zirconium, hafnium and titanium, and nitride forms of silicon.

39. The dielectric layer of claim 37, wherein the second dielectric material is selected from the group consisting of silicon dioxide, zirconium dioxide, hafnium dioxide, titanium dioxide and silicon nitride.

40. The dielectric layer of claim 37, wherein the aluminum oxide layer is formed by a method selected from the group consisting of thermal evaporation, electron-beam evaporation and ion-beam-assisted deposition.

41. The dielectric layer of claim 40, wherein a degree of porosity of the aluminum oxide layer is controlled during formation of the aluminum oxide layer using a method selected from the group consisting of ion bombardment and plasma activation.

42. The dielectric layer of claim 37, wherein the aluminum oxide layer has a packing density between approximately 0.66 and 0.999.

43. The dielectric layer of claim 37, wherein the dopant material constitutes approximately 0.1% to 30% by weight of the dielectric layer.

44. The dielectric layer of claim 37, wherein the aluminum oxide layer has a degree of porosity such that the dopant material in the pores of the aluminum oxide layer constitutes approximately 0.1% to 30% by weight of the dielectric layer.

45. The dielectric layer of claim 38, wherein second dielectric material is formed by blanket depositing the dopant material on the surface of the aluminum oxide layer and subsequently treating the dopant material to convert it to its oxide or nitride form.

46. The dielectric layer of claim 45, wherein excess dopant material is removed from the surface of the aluminum oxide layer prior to converting the dopant material to its oxide or nitride form.

47. The dielectric layer of claim 45, wherein the second dielectric material contains silicon dioxide formed by a chemical vapor deposition of silicon using dilute silane in nitrogen and a substrate temperature of approximately 300° C. to 350° C., followed by rapid thermal annealing the silicon in an oxygen-containing atmosphere.

48. The dielectric layer of claim 45, wherein the dopant material is deposited to a thickness less than or equal to an average diameter of the pores.

49. The dielectric layer of claim 37, wherein the dielectric layer is a gate dielectric layer of a field-effect transistor.

50. The dielectric layer of claim 37, wherein the dielectric layer is an intergate dielectric layer of a floating-gate field-effect transistor.

51. The dielectric layer of claim 37, wherein the dielectric layer is a capacitor dielectric layer of a capacitor.

\* \* \* \* \*